United States Patent [19]
Blair et al.

[11] 3,991,362
[45] Nov. 9, 1976

[54] TECHNIQUE FOR MONITORING THE OPERATIONAL INTEGRITY OF REMOTE ANALOG CIRCUITS

[75] Inventors: Gerard M. Blair, Towson; Roy S. Diffrient, Reisterstown; William D. Hewitt, Owings Mills, all of Md.

[73] Assignee: Westinghouse Electric Corporation, Pittsburgh, Pa.

[22] Filed: Feb. 7, 1975

[21] Appl. No.: 548,131

[52] U.S. Cl. .................................. 324/51; 340/214
[51] Int. Cl.² ................. G01R 31/02; G08B 29/00
[58] Field of Search .................... 324/51, 73, 52; 340/213 R, 214, 410, 248 A, 256, 276

[56] References Cited
UNITED STATES PATENTS

| | | | |
|---|---|---|---|
| 3,031,643 | 4/1962 | Sheftelman | 324/52 X |
| 3,517,306 | 6/1970 | Anderson et al. | 324/52 |
| 3,614,608 | 10/1971 | Giedd et al. | 324/73 R |
| 3,636,443 | 1/1972 | Singh et al. | 324/73 R |
| 3,678,379 | 7/1972 | Arvay et al. | 324/73 |
| 3,705,349 | 12/1972 | Arnold | 324/73 R |
| 3,716,783 | 2/1973 | Deering | 324/51 X |

OTHER PUBLICATIONS
B394,712, Jan. 1975, Patti, 324/73 R.

*Primary Examiner*—Gerard R. Strecker
*Attorney, Agent, or Firm*—M. P. Lynch

[57] ABSTRACT

Tamper test signals of varying magnitude and polarity are randomly applied to electronic sensing circuits to determine integrity of the sensing circuits. A monitoring circuit measures the response of the sensing circuit to the applied tamper test signals and responds to deviations from predetermined information indicative of sensing circuit integrity by generating output signals suitable for control or alarm purposes.

3 Claims, 2 Drawing Figures

TECHNIQUE FOR MONITORING THE OPERATIONAL INTEGRITY OF REMOTE ANALOG CIRCUITS

BACKGROUND OF THE INVENTION

Traditionally, the integrity of remote sensing devices, such as those used in security systems, are checked by determining the presence or absence of the excitation voltage supplied to the sensing device. Typically if the applied voltage corresponds to +V, an integrity check which indicates the presence of +V at the sensing device is interpreted as indicating integrity or lack of tampering with the sensing device. The absence of +V at the sensing device is interpreted as lack of integrity which typically produces an alarm or appropriate control signals. This rather simple and obvious approach to determining the integrity of sensing devices has been circumvented on numerous occasions wherein intruders have neutralized the effectiveness of security sensing devices by connecting a signal source of suitable magnitude and polarity, i.e. +V, across the leads of the sensing device and subsequently disconnecting the sensing device. Thus an integrity check of the sensing device will produce a false +V response which satisfies the requirement of the integrity checking system when, in fact, the sensing device has been disconnected.

SUMMARY OF THE INVENTION

There is disclosed herein with reference to the accompanying drawings a tamper test technique including a signal generating circuit and a signal measuring circuit wherein the signal generating circuit randomly applies tamper test electrical signals of varying magnitude and polarity to a sensing device while the measuring circuit is designed to evaluate the response of the sensing circuit to the applied tamper test signals to determine the integrity of the sensing device. The measuring circuit acts effectively as a comparator circuit comparing the random integrity signals applied to the sensing device to the signals reflected back from the sensing device. Any deviation between the expected reflected signal and the actual reflected signal results in an output signal suitable for control or alarm purposes.

In a system including many remote sensing devices and incorporating a conventional computer, the computer may be programmed to apply the random integrity checking signals due to the remote sensing devices as well as programmed to evaluate the signal reflected back from the remote sensing device to determine deviations from programmed information representing reflected signals expected from the sensing device in the absence of tampering.

BRIEF DESCRIPTION OF THE DRAWINGS

The invention will become more readily apparent from the following exemplary description in connection with the accompanying drawings.

DESCRIPTION OF THE PREFERRED EMBODIMENT

Figure 1:
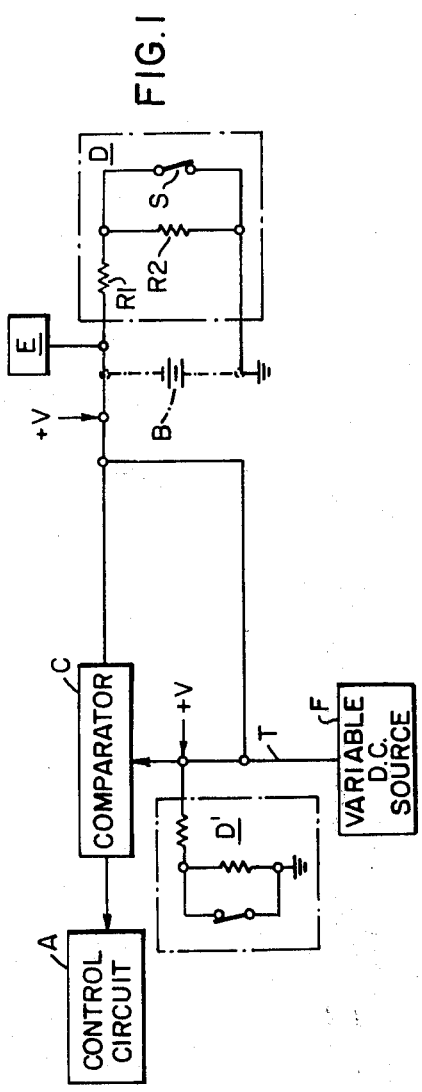
FIG. 1 is a schematic illustration of a tamper test circuit incorporating the invention.

Referring to FIG. 1, there is illustrated in a simplified schematic embodiment of the tamper test technique wherein the remote sensing device D, which is indicative of any one of numerous sensing devices or transducer such as would be used in a security or control system, consists of a voltage divided network including resistors R1 and R2 and a switch S which is actuated between a closed and open state in response to conditions monitored by the device D. For example, in a security system, the device D could be placed in a window in which case switch S would respond to movement of the window. An excitation voltage V is supplied to the sensing device D. Variations in the voltage across the divider circuit resulting from actuation of the switch S are monitored by a comparator circuit C.

One technique commonly used to defeat the sensing device D is to apply an external potential, herein illustrated as battery B, across the sensing device D wherein the polarity and magnitude of the externally applied potential B corresponds to the signal developed across the the voltage divider under normal operating conditions for the device D.

The effectiveness of this technique for neutralizing effectiveness of sensing device D is eliminated by randomly applying a tamper test signal of varying magnitude and/or polarity from a variable DC source F to the sensing device D. The application of a tamper test signal T in a random or irregular manner significantly reduces the likelihood of duplication of the tamper test signal for the purposes of neutralizing the sensing device D. The tamper test signal is simultaneously applied to a reference circuit D' which corresponds identically to the circuit of the sensing device D. The signal response of the sensing D and the reference circuit D' are supplied to a comparator circuit C. The comparator circuit C transmits an output signal to a control or alarm circuit A in response to a difference between the signal received from the sensing device D and the signal received from the reference circuit D'. In the absence of tampering with the sensing device D, the signals supplied to the comparator circuit C will be substantially identical. However, it is apparent, that if an external potential such as that represented by battery B is applied across the sensing device D in an effort neutralized the sensing device D, the voltage signal supplied to the comparator circuit C from the sensing device D will differ from the voltage signal supplied to the comparator circuit C by the reference circuit D. The comparator circuit C will respond to this deviation by transmitting an output signal to the control circuit A.

Figure 2:
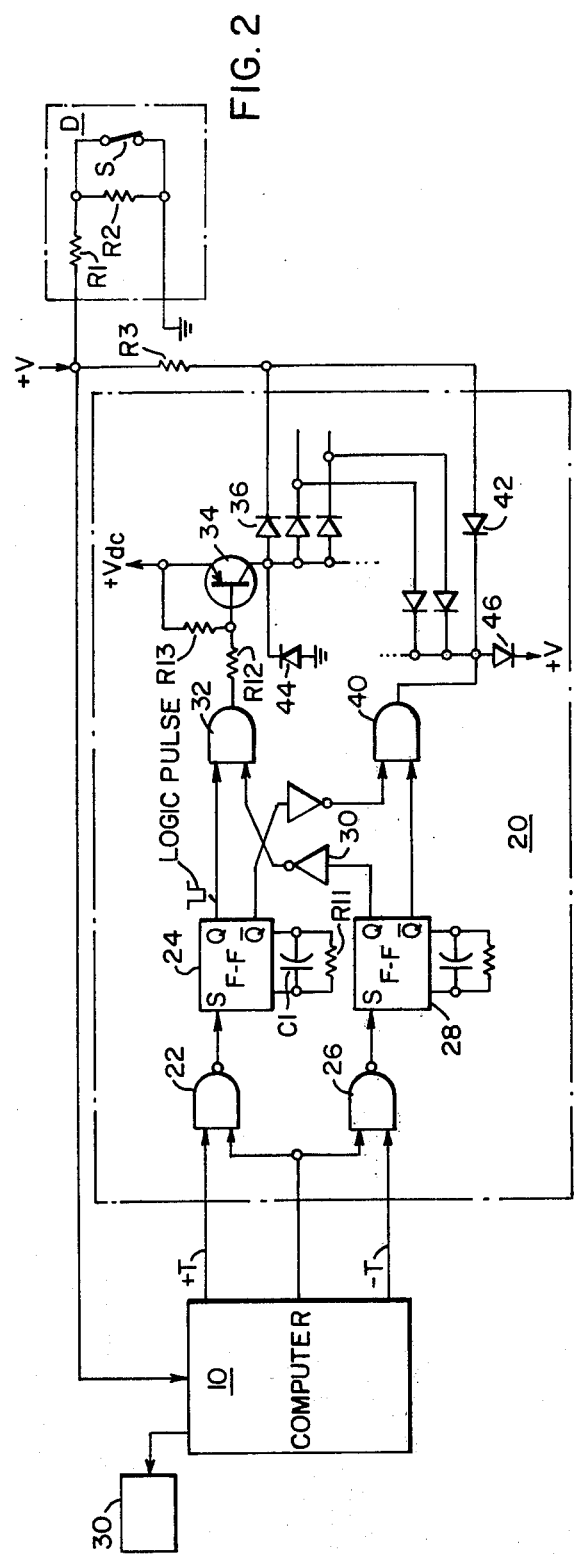
FIG. 2 is a schematic illustration of the embodiment of FIG. 1 wherein a conventional computer has been included for the purposes of initiating tamper test signals and evaluating the response of sensing devices to the tamper test signals.

There is illustrated schematically in FIG. 2 a conventional computer 10 which is substituted for the variable DC source F, the reference circuit D' and the comparator circuit C of the embodiment of FIG. 1. The computer 10 is programmed to apply tamper test initiating signals to a test circuit 20 which in turn applies tamper test signals of different polarities to the sensing device D. The computer 10 is further programmed to respond to the signals developed by the sensing device D in response to the tamper test signals to determine variation of the sensing device signals from predetermined stored information corresponding to the normal untampered state of the sensing device D. The computer responds to deviations of the signals developed by the sensing device D in response to tamper test signals from the predetermined information by developing an output signal for actuating a control circuit 30. The programming of the comparator to develop a predetermined sequence of tamper test signals as well as the programming of the computer to compare the output signals of the sensing device D to the stored information is well within the capability of skilled programmers utilizing conventional computers. The computer 10 will, for the sake of discussion, initiate both positive and negative tamper test signals. The positive polarity tamper test signal is indicated at a +T while the negative polarity tamper test signal is indicated at a −T. In the event of a positive tamper test signal +T, the signal is supplied through logic gate 22 to the input of a one shot circuit 24 which responds by developing an output logic pulse of a duration determined by the value of the resistors R11 and capacitor C1. In the absence of the negative tamper test signal, the output state of the gate 26 causes the one shot circuit 28 to supply a logic gating signal through the inverter 30 to gate the logic pulse output from the one shot circuit 24 through the logic gate 32 to switch the transistor 34 into conduction for the duration of the logic pulse. Logic gate 32 is a peripheral driver device, capable of switching the +V signal on the base of the transistor 34. The resistance value of the resistor R12 is such as to establish an acceptable base current while the value of the resistor R13 is established to assure transistor cutoff at the end of the logic pulse. When the transistor 34 is switched on, the $+V_{dc}$ potential is applied through diode 36 and resistor R3 to the sensing device D. The application of the $+V_{dc}$ to the resistor R3 tends to increase the voltage level at the sensing device D as seen by the computer 10. The value of the resistor R3 in combination with resistors R of the sensing device D determines the amount of voltage rise resulting from the application of the $+V_{dc}$ by the tamper test logic pulse. The computer 10 is programmed to respond to the predictable variation in voltage developed by the sensing device D in response to the predetermined application of the tamper test logic pulse by not initiating an output control signal. However, if an attempt is made to defeat the operating function of the sensing device D by disconnecting the device D or applying an external potential to the sensing device D as illustrated in FIG. 1 by battery B, the sensing device voltage seen by the computer 10 will vary from the predicted programmed value and the computer will respond by transmitting an output signal to the control circuit 30.

A negative polarity tamper test signal is initiated by computer 10 by applying a signal to the logic gate 26, the output of which is supplied to the one shot circuit 28 which develops an output logic pulse which is gated through the logic gate 40 by the output from the one shot circuit 24 in the absence of a positive test condition. The negative tamper test does not require the use of the transistor 34. The output of the logic gate 40 is switched from an open circuit condition to a ground condition for the duration of the pulse. During the duration of the pulse, the ground condition tends to lower the sensing device voltage through the resistor R3 and the diode 42 thus reducing the voltage seen by the computer 10.

The computer 10 responds to this deviation of the voltage level at the sensing device D from the stored predetermined value by transmitting an output signal to control circuit 30.

Diodes 44 and 46 function as clamping diodes to limit the voltage which may be applied to the transistor 34 and the logic gate 40, respectively. Clamping diodes minimize possible defeat of the tamper test system due to intentional circuit destruction. The additional diodes D indicate the capability of adding additional sensing devices D for tamper test evaluation by the computer 10 and the logic control circuit 20.

I claim:

1. A method for checking the operational integrity of one or more analog circuits having an operating potential applied thereto, comprising the steps of, sequentially applying individual test signals of different magnitudes and/or polarity to said analog circuit, combining each of said test signals with the applied operating potential of said analog circuit to produce a sequence of combined signals, developing a reference signal corresponding to each combination of said test signal and a signal indicative of an applied operating potential indicative of an acceptable level of operational integrity for said analog circuit, and comparing each of said combined signals to said corresponding reference signal to determine if the operational integrity of said analog circuit is at an acceptable level.

2. Apparatus for checking the operational integrity of an electrical circuit having an operating potential applied thereto, comprising, first means for sequentially applying individual test signals of different magnitudes and/or polarity to said analog circuit, second means for combining each said test signal and the operating potential applied to said electrical circuit to develop a sequence of combined signals, third means for developing a reference signal corresponding to each combination of said test signal and a signal corresponding to the operating potential of said electrical circuit under normal operating conditions, and fourth means for comparing said combined signals to said reference signals to determine if the operational integrity of said electrical circuit is at an acceptable level.

3. In a security system employing a plurality of remote analog circuits each having an operating potential applied thereto, a combination of, control circuit means operatively connected to said remote analog circuits and including:
a. means for sequentially applying individual test signals of varying magnitude and/or polarity to each of said remote analog circuits,
b. means for monitoring the combined signal formed by the combination of the operating potential at each of said analog circuits and each test signal applied thereto,
c. means for storing reference signal information representing a combined signal indicative of the combination of each applied test signal and applied operating potential corresponding to normal operation of said analog circuit,
d. means for comparing the combined signal to the corresponding stored reference information to develop an output signal indicative of the operational integrity of the remote analog circuit, and circuit means connected to said control circuit means to respond to said output signal indicative of the operational integrity of said remote analog circuit.

* * * * *